United States Patent [19]

Cogan

[11] 4,406,052
[45] Sep. 27, 1983

[54] NON-EPITAXIAL STATIC INDUCTION TRANSISTOR PROCESSING

[75] Inventor: Adrian I. Cogan, Waltham, Mass.

[73] Assignee: GTE Laboratories Incorporated, Waltham, Mass.

[21] Appl. No.: 320,241

[22] Filed: Nov. 12, 1981

[51] Int. Cl.³ .................... H01L 27/04; H01C 7/14
[52] U.S. Cl. ................... 29/576 B; 29/571; 29/578; 148/1.5; 148/187; 156/31; 156/32; 357/22; 357/91
[58] Field of Search ............... 29/576 B, 578, 571; 148/1.5, 187; 357/22, 91; 156/30, 31, 32

[56] References Cited

U.S. PATENT DOCUMENTS

| | | | |
|---|---|---|---|
| 3,828,230 | 8/1974 | Nishizawa et al. | 357/22 |
| 3,846,198 | 11/1974 | Wen et al. | 156/17 |
| 3,930,912 | 1/1976 | Wisbey | 156/3 |
| 4,193,836 | 3/1980 | Youmans et al. | 156/657 |
| 4,230,505 | 10/1980 | Wu et al. | 148/1.5 |
| 4,292,730 | 10/1981 | Ports | 29/577 C |
| 4,317,127 | 2/1982 | Nishizawa | 357/15 |

OTHER PUBLICATIONS

Shino et al. Jap. Jour. Appl. Physics 19 (1980) Suppl. 19-1, pp. 283-287.

Primary Examiner—Upendra Roy
Attorney, Agent, or Firm—J. Stephen Yeo; Theodore D. Lindgren

[57] ABSTRACT

A method for fabricating a static induction transistor starting with a high resistivity substrate on which a gate-source structure is formed. The gate-source structure is covered by a supporting layer and the wafer is etched to desired thickness. Ions are implanted in the etched surface and a drain electrode is deposited. A thick metal support layer and heat sink is electroplated on the drain electrode.

2 Claims, 5 Drawing Figures

NON-EPITAXIAL STATIC INDUCTION TRANSISTOR PROCESSING

CROSS REFERENCE TO RELATED APPLICATIONS

The following co-pending applications related to structures and/or processing of field or static induction transistors. All are assigned to the same assignee as the present invention.

Ser. No. 130,896, filed Mar. 17, 1980, in the name of Adrian I. Cogan, entitled "Static Induction Transistors".

Ser. No. 219,473, filed Dec. 23, 1980, in the name of Adrian I. Cogan, entitled "Low Capacitance Self-Aligned Semiconductor Electrode Structure and Method of Fabrication".

Ser. No. 255,083, filed Apr. 17, 1981, in the name of Paul O. Haugsjaa, entitled "Field Effect Semiconductor Device".

Ser. No. 320,238, filed Nov. 12, 1981, in the name of Adrian I. Cogan, entitled "Power Static Induction Transistor Fabrication", now U.S. Pat. No. 4,375,124.

Ser. No. 320,239, filed Nov. 12, 1981, in the name of Adrian I. Cogan, entitled "High Frequency Static Induction Transistor".

Ser. No. 320,240, filed Nov. 12, 1981, in the name of Adrian I. Cogan, entitled "Self-Aligned High-Frequency Static Induction Transistor".

Ser. No. 320,242, filed Nov. 12, 1981, in the name of Adrian I. Cogan, entitled "Etched-Source Static Induction Transistor".

BACKGROUND OF THE INVENTION

This invention relates to a method for fabricating a static induction transistor and, in particular, to a method for fabrication which does not require growth of a high resistivity epitaxial semiconductor layer.

The static induction transistor is a field effect semiconductor device capable of operation at relatively high frequency and power. The transistors are characterized by a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974.

The static induction transistor generally uses vertical geometry with source and drain electrodes placed on opposite sides of a thin, high resistivity layer of one conductivity type. Gate regions of opposite conductivity type are positioned on opposite sides of the source. During operation a reverse bias is applied between the gate region and the high resistivity region causing a depletion region to extend into the channel below the source. As the magnitude of the reverse bias is varied, the source-drain current and voltage derived from an attached source of energy will also vary.

The gate-source structures for such devices are commonly formed on and in a high resistivity epitaxial semiconductor layer grown on a highly doped semiconductor substrate. The growing of high resistivity, defect-free epitaxial layers requires expensive equipment, long processing time and very stringent processing control, particularly where thick epitaxial layers are formed.

SUMMARY OF THE INVENTION

The present invention discloses an economical method for eliminating the expensive and delicate epitaxial process commonly used to fabricate static induction transistors.

The process of the present invention starts with an inexpensive, high resistivity silicon wafer. Source and gate structures are formed using conventional lithographic, etching, epitaxial, and/or diffusion techniques. Metal electrodes for the source and gate are deposited, using patterning if necessary. The source-gate surface of the wafer is then covered with a support material such as an epoxy, which serves as a handling support during the next processing steps. The covered wafer is immersed in an etching mix and the unsupported surface is etched to the final thickness of the wafer. A shallow high density ion implantation step follows. Next, the metal drain electrode is deposited and a thick metal layer is formed. Finally, the source-gate surface supporting layer is removed.

The elements of the Figures are not drawn to scale and the Figures are intended only for use in explanation of the fabrication steps of the present invention.

DETAILED DESCRIPTION OF THE INVENTION

Figure 1:
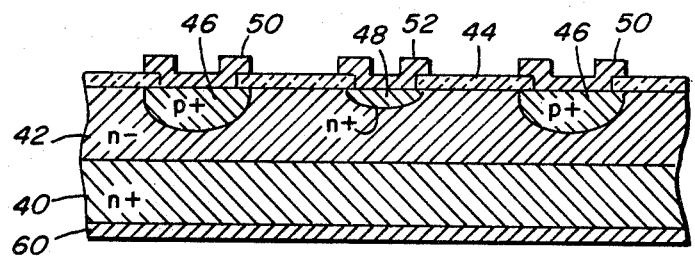
FIG. 1 is a cross-sectional view of a segment of a prior-art static induction transistor.

Referring to FIG. 1, in prior art processes a slice or substrate 40, of single crystal semiconductor material of one conductivity type is provided as the supporting structure for fabrication of a field effect semiconductor device or static induction transistor. The substrate is commonly of silicon which has been highly doped with n-type impurities. A thin, high resistivity epitaxial layer 42 is grown on substrate 40. Typically, substrate 40 has a thickness of 200 microns and epitaxial layer 42 a thickness of 30 microns. The gate-source structure is formed on and in epitaxial layer 40. The illustrated gate-source structure is of the surface-gate type and is comprised of silicon dioxide layer 44, diffused p-type gate regions 46, source region 48, gate electrodes 50 and source electrode 52. Drain electrode 60 is deposited on the surface opposite the gate-source surface. While a surface gate structure is illustrated, the term gate-source as used herein includes, for example, buried or recessed-gate structures. The low resistivity layer 40 provides mechanical support for wafer handling during processing.

Figure 2:
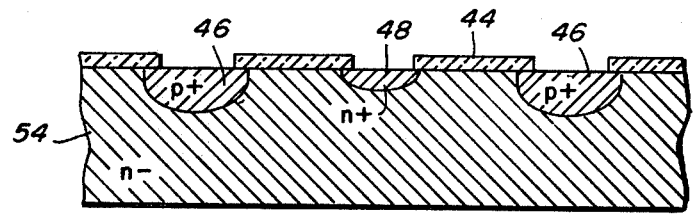
FIG. 2 is a cross-sectional view of a segment of a high resistivity semiconductor crystal into which gate and source regions have been diffused.

FIG. 2 illustrates a fragment of a semiconductor wafer during processing of a static induction transistor according to a preferred embodiment of the present invention. The processing starts with an inexpensive, high resistivity silicon wafer 54 having, for example, a relatively uniform thickness of 200 microns and approximately 40 ohm-cm resistivity. An illustrative gate-source structure is formed on wafer 54 by, for example, forming silicon dioxide layer 44 on the upper surface, etching gate and source windows in silicon dioxide layer 44, and diffusing gate regions 46 and source regions 48 into wafer 54.

Figure 3:
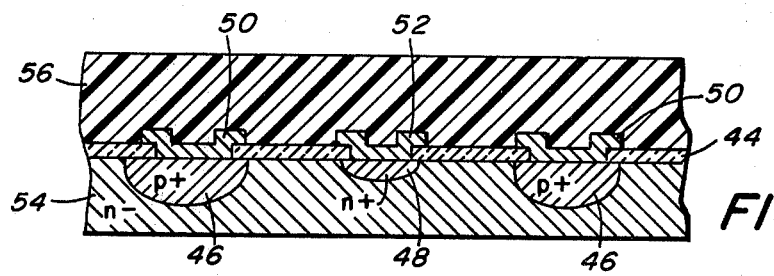
FIG. 3 illustrates protection of the completed gate-source structure and etched removal of the lower surface of the high resistivity crystal.

As illustrated in FIG. 3, metal gate and source electrodes 50 and 52 are deposited and patterned to complete the illustrative gate-source structure. The gate-source structure is then covered with support layer 56 which may be comprised, for example, of an epoxy material 300 microns thick. Support layer 56 serves as a handling support during the next processing steps. The covered wafer is then etched to remove the lower surface of silicon wafer 54 until the desired thickness of the transistor channel region is reached. The etching may be accomplished, for example, by immersing the entire covered wafer in an etching mix. Silicon wafer 54 may have, for example, a thickness of 30 microns upon completion of the etching step.

The purpose of etching wafer 54 is to provide a resultant device with desired electrical characteristics of high frequency and high voltage operation. This step reduces the thickness of the high resistivity layer which significantly reduces the thermal resistance of wafer 54 thereby improving the power handling characteristics of the resultant device. The particular thickness of wafer 54 will depend upon the desired frequency characteristics and breakdown voltage desired for the resultant device.

Figure 4:
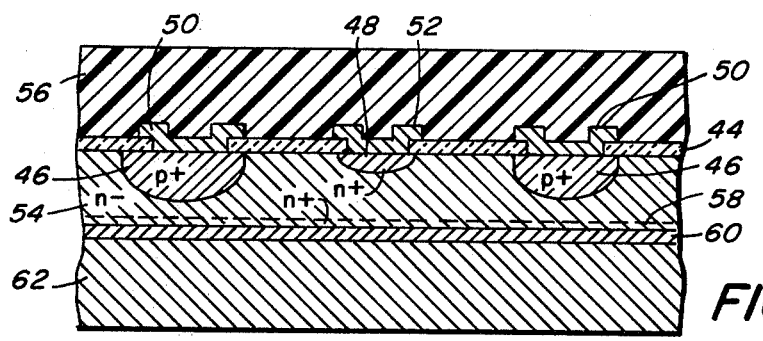
FIG. 4 illustrates formation of the drain structure.

Referring to FIG. 4, a shallow high dose implanatation of n-type ions is made on the etched surface 58 of silicon layer 54 to provide a shallow high concentration layer adjacent to surface 58. This step provides improved drain ohmic contact. No high temperature drive-in diffusion step is required, a short laser annealing step being sufficient to accomplish the purpose. Metal drain electrode 60 is then deposited on the implanted surface. Typically, the deposited thickness is on the order of 1 micron. A thick metal layer 62 is then electroplated on drain electrode 60. Metal layer 62 may be, for example, 150 microns in depth. Layer 62 provides mechanical support for the thin wafer after support layer 56 is removed and provides an integral heat sink for the final device.

Figure 5:
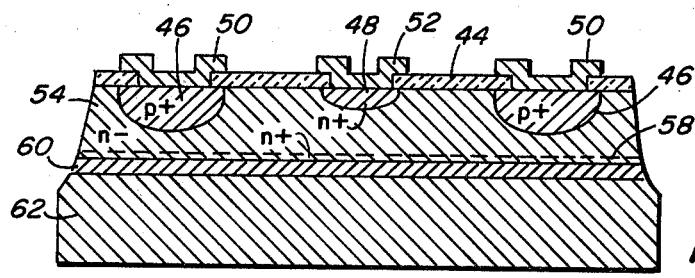
FIG. 5 illustrates removal of the protective layer from the gate-source structure and separation of devices.

As indicated in FIG. 5, support layer 56 is removed and individual devices are separated by chemical etching prior to mounting in final package form.

In the various figures a cross-section of a static induction transistor is shown. Gate regions 46 are formed as strips, for example, 100 to 120 microns in length normal to the plane of the cross-section. Similarly, source region 48 is formed as a strip, for example, about 15 to 20 microns shorter than the gate regions 46. The length of the regions is primarily limited by the maximum permitted voltage drop along the electrodes which contact the regions. Additionally, a device with a single source and two gates is shown in FIG. 5. For increased power handling capability additional cells or gate-source combinations can be added as is the normal practice without departing from the scope of the invention.

The process of the present invention is of particular value for those applications in which the design parameters of the static induction transistor require a thick high resistivity layer.

What is claimed is:

1. A method for fabricating a non-epitaxial static induction transistor, said method comprising the steps of:

fabricating a gate-source structure on a high resistivity silicon semiconductor wafer of one conductivity type having substantially uniform thickness;

covering said gate-source structure with a thick support layer;

etching the surface of said wafer opposite said support layer until the thickness of said wafer is decreased to approximately 30 microns;

implanting said etched surface with ions of said one conductivity type, said implantation providing a shallow high concentration layer;

depositing a metal drain electrode on said implanted surface;

electroplating a thick metal layer over said metal drain electrode; and removing said thick support layer from said gate-source structure.

2. A method as defined in claim 1 wherein said resistivity of said wafer is approximately forty ohm-centimeters.

* * * * *